(12) United States Patent
Chang et al.

(10) Patent No.: US 10,916,427 B2
(45) Date of Patent: Feb. 9, 2021

(54) FORMING CONTACT HOLES USING LITHO-ETCH-LITHO-ETCH APPROACH

(71) Applicant: UNITED MICROELECTRONICS CORP., Hsin-Chu (TW)

(72) Inventors: Ching-Chih Chang, Tainan (TW); Yuan-Fu Ko, Tainan (TW); Chih-Sheng Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/033,179

(22) Filed: Jul. 11, 2018

(65) Prior Publication Data

US 2020/0020576 A1 Jan. 16, 2020

(51) Int. Cl.
*H01L 21/033* (2006.01)
*H01L 21/768* (2006.01)
*H01L 21/311* (2006.01)
*H01L 21/02* (2006.01)
*H01L 21/47* (2006.01)

(52) U.S. Cl.
CPC .... *H01L 21/0337* (2013.01); *H01L 21/02172* (2013.01); *H01L 21/31144* (2013.01); *H01L 21/47* (2013.01); *H01L 21/76816* (2013.01); *H01L 21/76831* (2013.01)

(58) Field of Classification Search
CPC ............. H01L 21/0337; H01L 21/0338; H01L 21/76802–76837
See application file for complete search history.

(56) References Cited

U.S. PATENT DOCUMENTS

| | | | |
|---|---|---|---|
| 10,032,633 B1 * | 7/2018 | Chen | .................... H01L 21/0274 |
| 2005/0277276 A1 | 12/2005 | Stephens | |
| 2007/0018286 A1 | 1/2007 | Chen | |
| 2007/0020565 A1 | 1/2007 | Koh | |
| 2010/0248436 A1 * | 9/2010 | Lee | ...................... H01L 21/0332 |
| | | | 438/268 |
| 2014/0193974 A1 * | 7/2014 | Lee | .................... H01L 21/76816 |
| | | | 438/669 |

* cited by examiner

*Primary Examiner* — Daniel Luke
(74) *Attorney, Agent, or Firm* — Winston Hsu (57) ABSTRACT

The present invention provides a method for forming a semiconductor device, comprising: first, a target layer is provided, an etching stop layer is formed on the target layer, afterwards, a first photoresist layer is formed on the etching stop layer, and a first etching process is then performed, to forma plurality of first trenches in the etching stop layer. Next, a second photoresist layer is formed on the etching stop layer, portion of the second photoresist layer fills in each first trench, a second etching process is then performed to form a plurality of second trenches in the etching stop layer, and using the remaining etching stop layer as a hard mask, a third etching process is performed to remove parts of the target layer.

9 Claims, 6 Drawing Sheets

FORMING CONTACT HOLES USING LITHO-ETCH-LITHO-ETCH APPROACH

BACKGROUND OF THE INVENTION

1. Field of the Invention

The present invention generally relates to semiconductor manufacturing process, and more particularly, to a method for improving the accuracy of the contact holes in a litho-etch-litho-etch (2P2E) approach.

2. Description of the Prior Art

Optical lithography is a crucial step in semiconductor manufacturing. The basic principle of optical lithography is quite similar to that of chemistry-based photography. Images of a patterned photo-mask are projected through high-precision optical systems onto a wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

As the gap between the required feature size and the lithography wavelength gets bigger, the final wafer images are quite different from the original patterns of the mask. In the past few years, resolution enhancement techniques (RETS) have become necessary in order to achieve the required pattern density. One well-known RET is the optical proximity correction (OPC), in which the mask patterns are intentionally "distorted" so that the desired image can be formed on the wafer. Nowadays, considerable amount of computing power has to be dedicated to these kinds of post-layout processes.

In addition to the above-mentioned OPC technology, a process of double patterning has been developed as a cost-effective way to further scale into the deep submicron domain, using the same lithographic technology. One popular form of double patterning is the double exposure lithography, wherein a given layout is split or decomposed into two sets of patterns, each of which is printed using a separate mask in a separate exposure step. The desired layout may be constructed by these two separate patterns.

The greatest advantage of the double exposure lithography is that we can use available photo-lithography technology and tools to manufacture finer patterns with even higher density. However, there are still many process issues to overcome in practice. It is still necessary to improve the conventional pattern split method for double exposure process.

SUMMARY OF THE INVENTION

The present invention provides a method for forming a semiconductor device, comprising: first, a target layer is provided, an etching stop layer is formed on the target layer, afterwards, a first photoresist layer is formed on the etching stop layer, and a first etching process is then performed, to forma plurality of first trenches in the etching stop layer. Next, a second photoresist layer is formed on the etching stop layer, portion of the second photoresist layer fills in each first trench, a second etching process is then performed to form a plurality of second trenches in the etching stop layer, and using the remaining etching stop layer as a hard mask, a third etching process is performed to remove parts of the target layer.

The present invention further provides a method for forming a semiconductor device, comprising: first, a target layer is provided, an etching stop layer is formed on the target layer, a top oxide layer is formed on the etching stop layer, afterwards, a first photoresist layer is formed on the top oxide layer, and a first etching process is then performed, to form a plurality of first trenches in the top oxide layer. Next, a second photoresist layer is formed on the top oxide layer, portion of the second photoresist layer fills in each first trench, a second etching process is then performed to form a plurality of second trenches in the top oxide layer, and using the remaining etching stop layer as a hard mask, a third etching process is performed to remove parts of the etching stop layer and parts of the target layer.

In the process mentioned above, the etching stop layer is additionally formed on the oxide layer, and the first lithography process, the first etching process, the second lithography process and the second etching process (also called 2P2E process) are performed sequentially, so as to pattern the etching stop layer. Since the thickness of the etching stop layer is relative small, so the height of the second patterned photoresist layer will not be decreased significantly. In this way, it can use the same or similar manufacturing parameters during the second exposure development and the second etching process as the first exposure development and the second etching process, thereby improving the accuracy of the overall semiconductor device (for example, the critical dimension of each trench opening can be maintained).

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
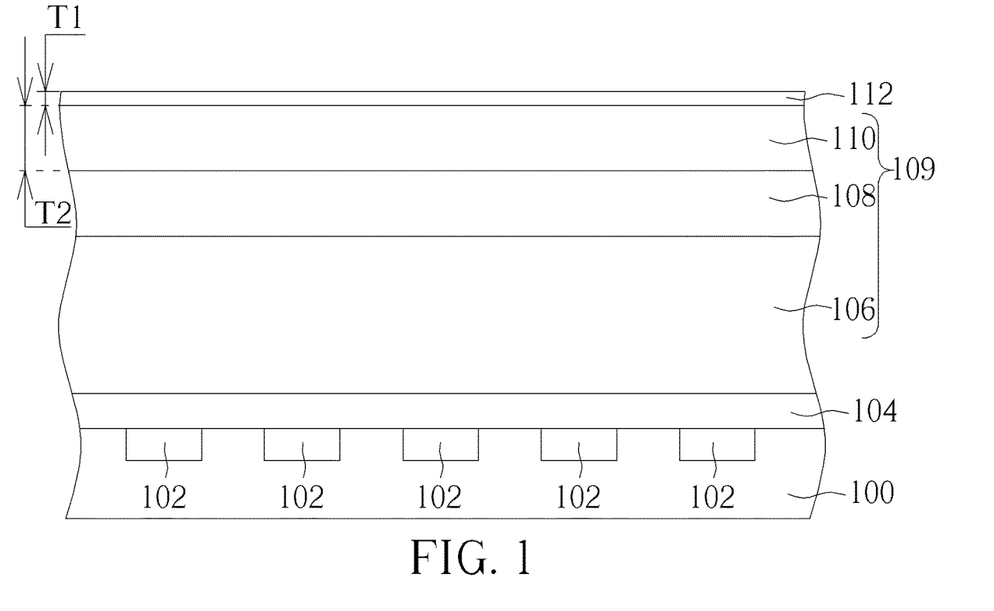
FIGS. 1-6 are schematic diagrams illustrating a method of fabricating a semiconductor device according to the first preferred embodiment of the present invention.

The present invention provides a method of fabricating a dual damascene structure. Please refer to FIG. 1 through FIG. 6, which are schematic diagrams illustrating a method of fabricating a semiconductor device according to the first preferred embodiment of the present invention. As shown in FIG. 1, a substrate 100 is provided, and the substrate 100 includes a plurality of conductive layers 102 and a base layer 104 covering the conductive layers 102. The substrate 100 may include other semiconductor elements (not shown). The conductive layers 102 could be any kind of conductive elements, including gate electrodes, source electrodes, contact plugs, via plugs, conductive lines etc., or metal contacts. Furthermore, the base layer 104 could be made of dielectric material, for example, the base layer 104 may be a nitrogen doped silicon carbide (NDC) layer, but not limited thereto. Subsequently, a dielectric layer 106, a mask layer 108 and an oxide layer 110 are sequentially formed on the substrate 100. In this embodiment, a target layer 109 is defend, and the target layer 109 includes the dielectric layer 106, the mask layer 108 and the oxide layer 110. A material of the dielectric layer 106 may include low dielectric constant (low-K) material (K value smaller than 3.9), ultra-low-K (ULK) material (K value smaller than 2.6), or porous ULK material. The thickness of the mask layer 108 is preferably smaller than 500 angstroms. A material of the mask layer 108 may include metal oxide or metal nitride, but not limited thereto. Moreover, an etching stop layer 112 is formed on the oxide layer 110, the etching stop layer 112 may include a single layered structure made of materials having high selectivity with the material of the oxide layer 110, in other words, when an etching process is performed, the etching rate for etching the etching stop layer 112 and the etching rate for etching the oxide layer 110 are significantly different. In this embodiment, the etching stop layer 112 may include metal nitride, metal oxide or silicon oxynitride, such as $Ti_xN_y$, $Al_xN_y$, $Ta_xN_y$, $Ti_xO_y$, $Al_xO_y$, $Ta_xO_y$, $Si_xO_yN_z$, $Si_xC_y$, $Si_xO_yC_z$, and x, y and z are positive integers. However, the present invention is not limited thereto. The etching stop layer 112 may include other suitable materials having high selectivity with the oxide layer 110.

In this embodiment, compared to the thickness of the oxide layer 110, the thickness of the etching stop layer 112 is much thinner. As shown in FIG. 1, a thickness of the etching stop layer 112 is labeled as T1, and a thickness of the oxide layer 110 is labeled as T2, preferably, T1/T2 is smaller than 0.4. Besides, in this embodiment, T1 is preferably smaller than 200 angstroms.

Figure 2:
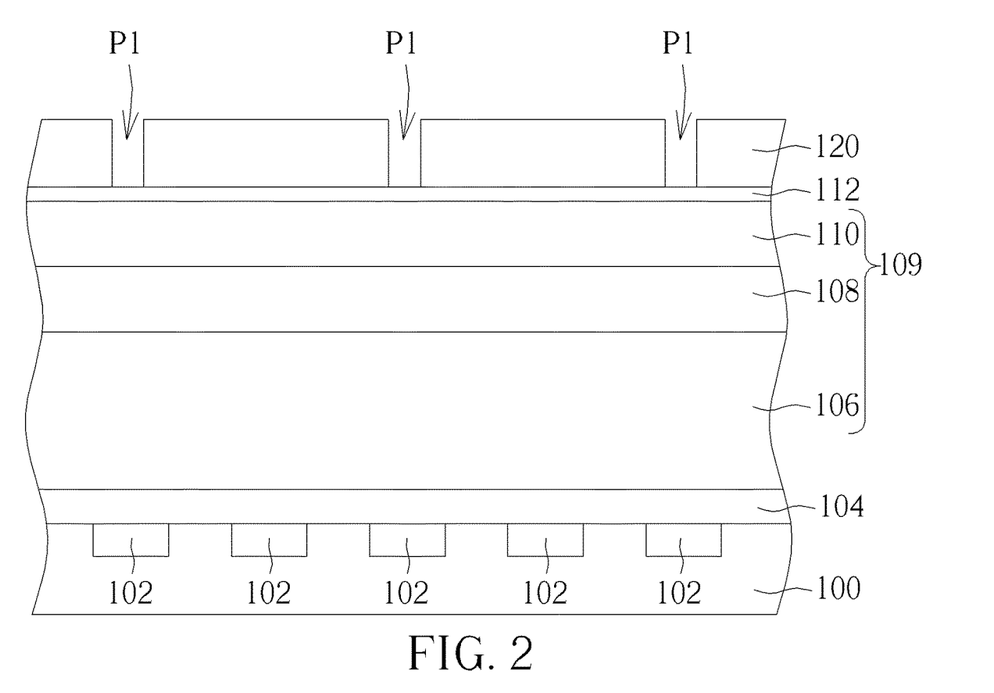
Figure 3:
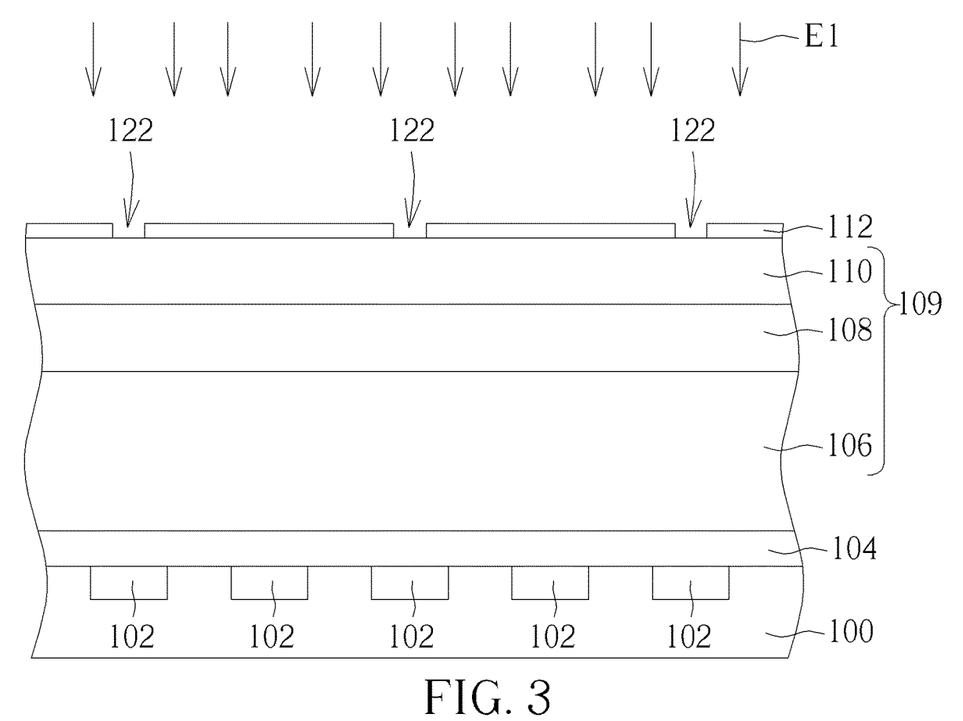
Figure 4:
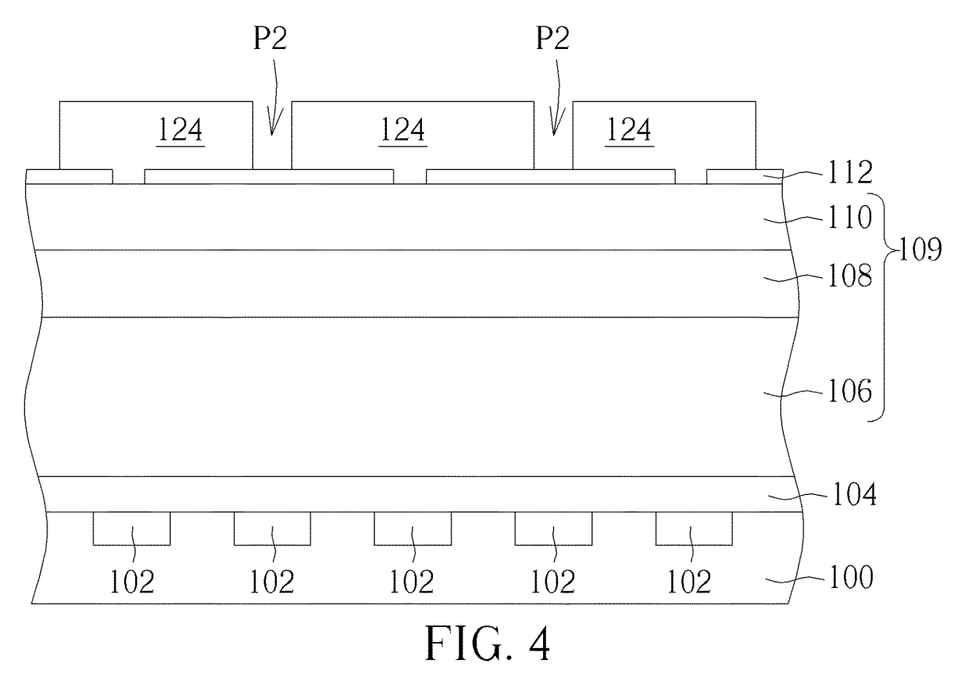

As shown in FIG. 2 and FIG. 3, a first photoresist layer (not shown) is formed on the etching stop layer 112, and a first exposure and development process (not shown) is performed to the first photoresist layer, so as to pattern the first photoresist layer and to form a first patterned photoresist layer 120 on the etching stop layer 112, the first patterned photoresist layer 120 preferably includes the pattern P1 that defines first trench openings, and the methods for forming the first patterned photoresist layer 120 are known to those skilled in the art, so the details are omitted herein for brevity. Subsequently, as shown in FIG. 3, the first patterned photoresist layer 120 is used as the hard mask, and a first etching process E1 is performed to form at least a first trench 122 in the etching stop layer 112. It is appreciated that, a top surface of the oxide layer 110 is exposed in a bottom of the first trench 122, i.e. the first trench 122 does not penetrate through the oxide layer 110. Afterwards, the remained first patterned photoresist layer 120 is removed Afterwards, as shown in FIG. 4, a second photoresist layer (not shown) is then formed on the etching stop layer 112 and in the first trench 122. Next, a second exposure and development process (not shown) is performed to the second photoresist layer, so as to pattern the second photoresist layer and to form a second patterned photoresist layer 124 on the etching stop layer 112 and in the first trench 122, the second patterned photoresist layer 124 preferably includes the pattern P2 to define second trench openings, and the methods for forming the second patterned photoresist layer 124 are known to those skilled in the art, so the details are omitted herein for brevity.

The purpose of forming the additional etching stop layer 112 on the oxide layer 110 will be explained in this paragraph: In the embodiment mentioned above, the etching stop layer 112 is additionally formed on the oxide layer 110, and the thickness of the etching stop layer 112 is much smaller than the thickness of the dielectric layer 106. Therefore, the depth of each first trench 122 formed in the etching stop layer 112 is shallow (for example, smaller than 200 angstroms). In this way, if the process parameters for forming the second patterned photoresist layer 124 are the same as those for forming the first patterned photoresist layer 120, the total volume of the second photoresist layer should also be the same as the total volume of the first photoresist layer. After the second photoresist layer is formed, since part of the second photoresist layer will fill in the first trenches 122, so the height of the top surface of the second photoresist layer will decrease. However, as mentioned above, the depth of each first trench 122 formed in the etching stop layer 112 is shallow, so only a small part of the second photoresist layer fills into the first trenches 122, and the top surface of the second photoresist layer will not be decreased significantly. In other words, even though parts of the second patterned photoresist layer 124 fills into the first trenches 122, but the height of the second patterned photoresist layer 124 is very close to the height of the first patterned photoresist layer 120 (for example, according to applicant's experiment, the height difference between the first patterned photoresist layer 120 and the second patterned photoresist layer 124 is smaller than 200 angstroms), so the etching process performed in the following steps will not be affected, thereby improving the accuracy of the process.

Figure 5:
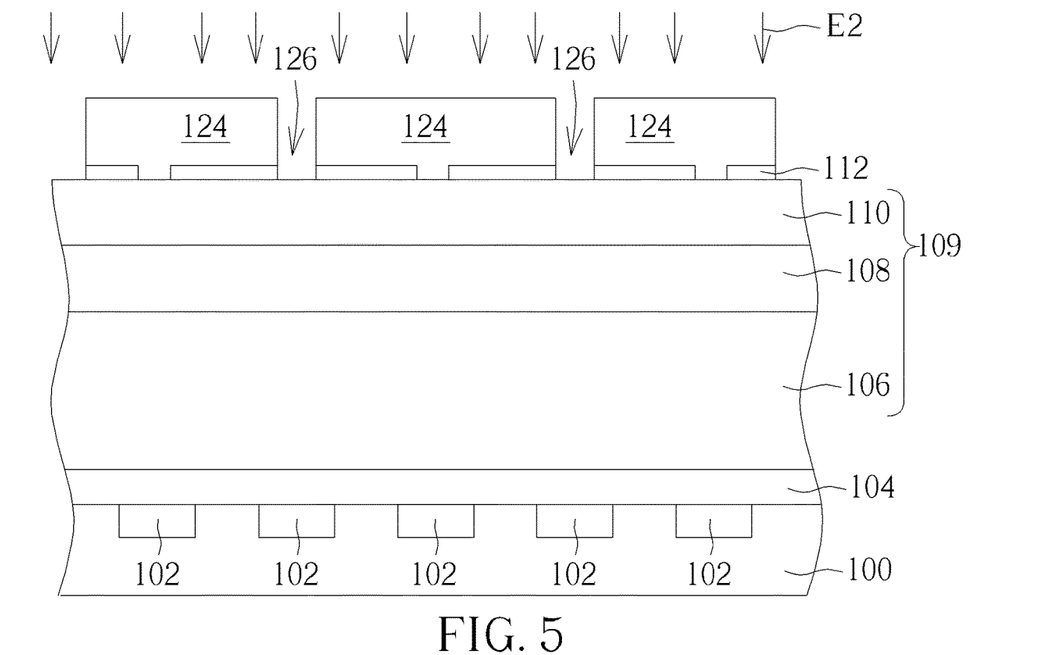

Next, as shown in FIG. 5, the second patterned photoresist layer 124 is used as the hard mask, and a second etching process E2 is performed to form at least a second trench 126 in the etching stop layer 112. In this embodiment, each first trench 122 and each second trench 126 are preferably not overlapped ith each other. It is appreciated that, a top surface of the oxide layer 110 is exposed in a bottom of the second trench 126, i.e. the second trench 126 does not penetrate through the oxide layer 110.

Figure 6:
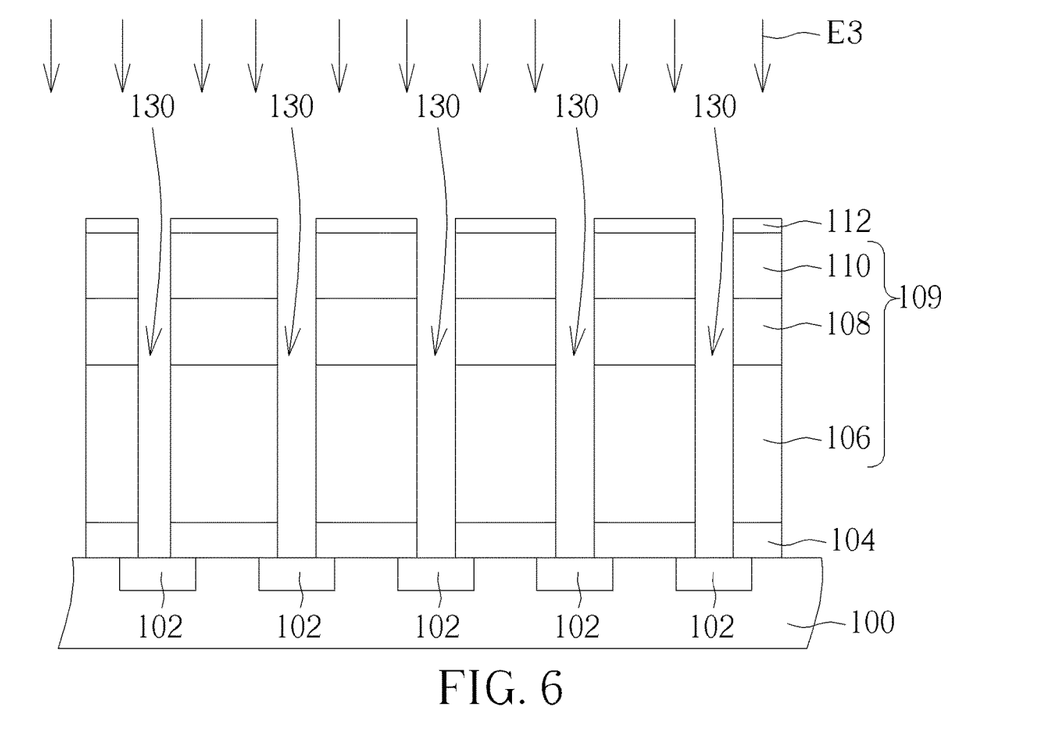

Next, as shown in FIG. 6, after the remained second patterned photoresist layer 124 is removed, the remained etching stop layer 112 is used as the hard mask, and a third etching process E3 is performed, the third etching process may include multiple steps etching processes, to etch the oxide layer 110, the mask layer 108, the dielectric layer 106 and the base layer 104 sequentially. A plurality of third trench openings 130 are formed in the dielectric layer 106. Each third trench opening 130 preferably exposes the conductive layers 102. In the following steps, conductive layer (not shown) may be filled into each third trench openings 130, so as to form a plurality of contact plugs, via plugs or other suitable elements. Since those steps are well-known to those skilled in the art, the details are omitted from the preferred embodiment in the interest of brevity.

In summary, in the process mentioned above, the etching stop layer 112 is additionally formed on the oxide layer 110, and the first lithography process, the first etching process, the second lithography process and the second etching process (also called 2P2E process) are performed sequentially, so as to pattern the etching stop layer 112. Since the thickness of the etching stop layer 112 is relative small, so the height of the second patterned photoresist layer 124 will not be decreased significantly. In this way, it can use the same or similar manufacturing parameters during the second exposure development and the second etching process as the first exposure development and the second etching process, thereby improving the accuracy of the overall semiconductor device (for example, the critical dimension of each trench opening can be maintained).

The following description will detail the different embodiments of the method for forming the semiconductor device of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
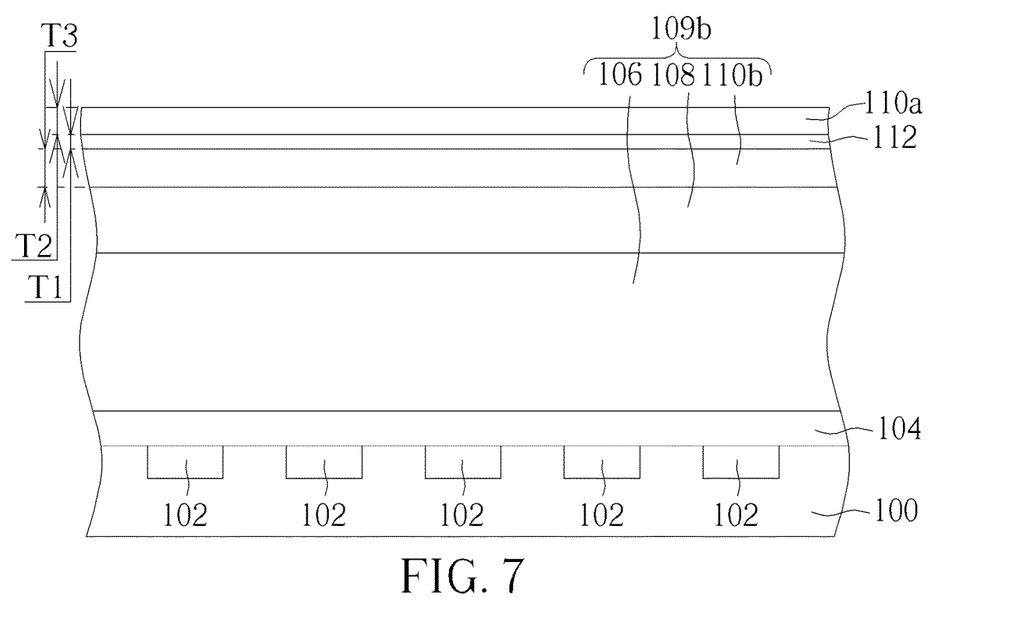
FIGS. 7-12 are schematic diagrams illustrating a method of fabricating a semiconductor device according to the second preferred embodiment of the present invention.

Please refer to FIG. 7 through FIG. 12, which are schematic diagrams illustrating a method of fabricating a semiconductor device according to the second preferred embodiment of the present invention. As shown in FIG. 7, a substrate 100 is provided, and the substrate 100 includes a plurality of conductive layers 102 and a base layer 104 covering the conductive layers 102. The substrate 100 may include other semiconductor elements (not shown). The conductive layers 102 could be any kind of conductive elements, including gate electrodes, source electrodes, contact plugs, via plugs, conductive lines etc., or metal contacts. Furthermore, the base layer 104 could be made of dielectric material, for example, the base layer 104 may be a nitrogen doped silicon carbide (NDC) layer, but not limited thereto. Subsequently, a dielectric layer 106, a mask layer 108 and a bottom oxide layer 110b are sequentially formed on the substrate 100. In this embodiment, a target layer 109b is defend, and the target layer 109b includes the dielectric layer 106, the mask layer 108 and the bottom oxide layer 110b. A material of the dielectric layer 106 may include low dielectric constant (low K) material (K value smaller than 3.9), ultra-low-K (ULK) material (K value smaller than 2.6), or porous ULK material. A material of the mask layer 108 may include metal oxide or metal nitride, but not limited thereto. Moreover, an etching stop layer 112 is formed on the bottom oxide layer 110b, and a top oxide layer 110a is formed on the etching stop layer 112. Preferably, the material of the top oxide layer 110a is same as the material of the bottom oxide layer 110b. The etching stop layer 112 may include a single layered structure made of materials having high selectivity with the material of the top oxide layer 110a, in other words, when an etching process is performed, the etching rate for etching the etching stop layer 112 and the etching rate for etching the top oxide layer 110a are significantly different. In this embodiment, the etching stop layer 112 may include metal nitride, metal oxide or silicon oxynitride, such as TixNy, AlxNy, TaxNy, TixOy, AlxOy, TaxOy, SixOyNz, SixCy, SixOyCz, and x, y and z are positive integers. However, the present invention is not limited thereto. The etching stop layer 112 may include other suitable materials having high selectivity with the top oxide layer 110a.

The difference between this embodiment and the first preferred embodiment mentioned above is that the additional top oxide layer 110a is formed on the etching stop layer 112. Compared with the first embodiment mentioned above, the oxide layer 110 is divided into two parts: the top oxide layer 110a and the bottom oxide layer 110b, disposed on and under the etching stop layer 112 respectively. Besides, compared to the thickness of the oxide layer 110 (the sum of the top oxide layer 110a and the bottom oxide layer 110b), the thickness of the etching stop layer 112 is much thinner. As shown in FIG. 7, a thickness of the etching stop layer 112 is labeled as T1, and a thickness of the top oxide layer 110a is labeled as T2, a thickness of the bottom oxide layer 110b is labeled as T3, preferably, T1/(T2+T3) is smaller than 0.4, T2/T3 is smaller than 0.66. Besides, in this embodiment, T1 is preferably smaller than 200 angstroms, T2 is preferably smaller than 200 angstroms, and T3 is preferably smaller than 300 angstroms.

Figure 8:
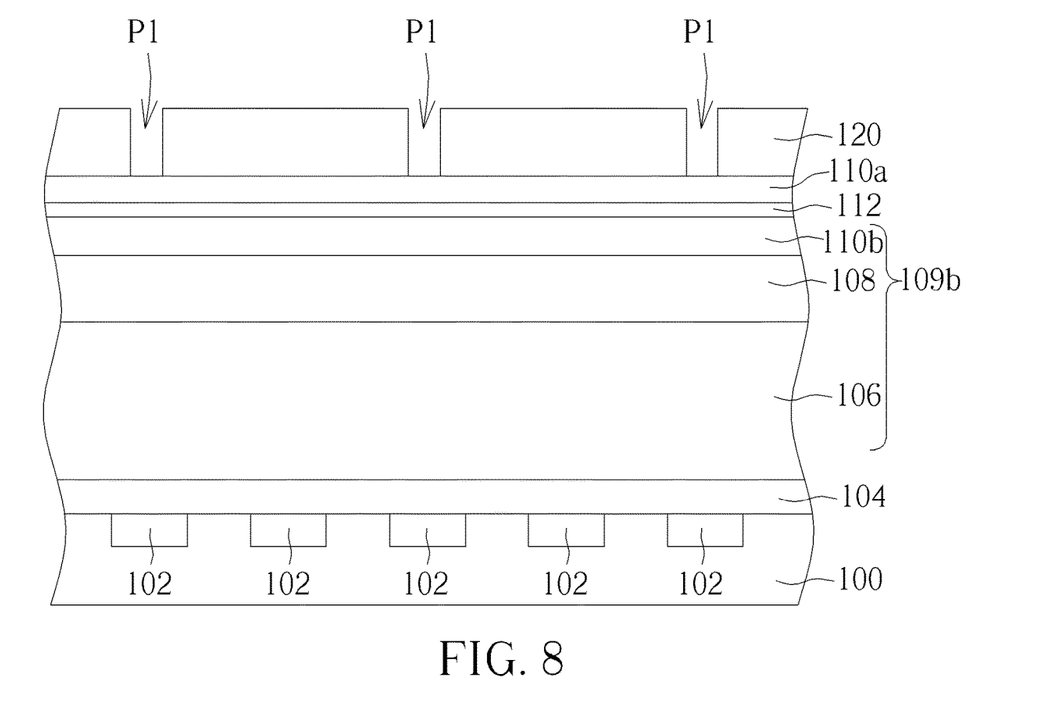
Figure 9:
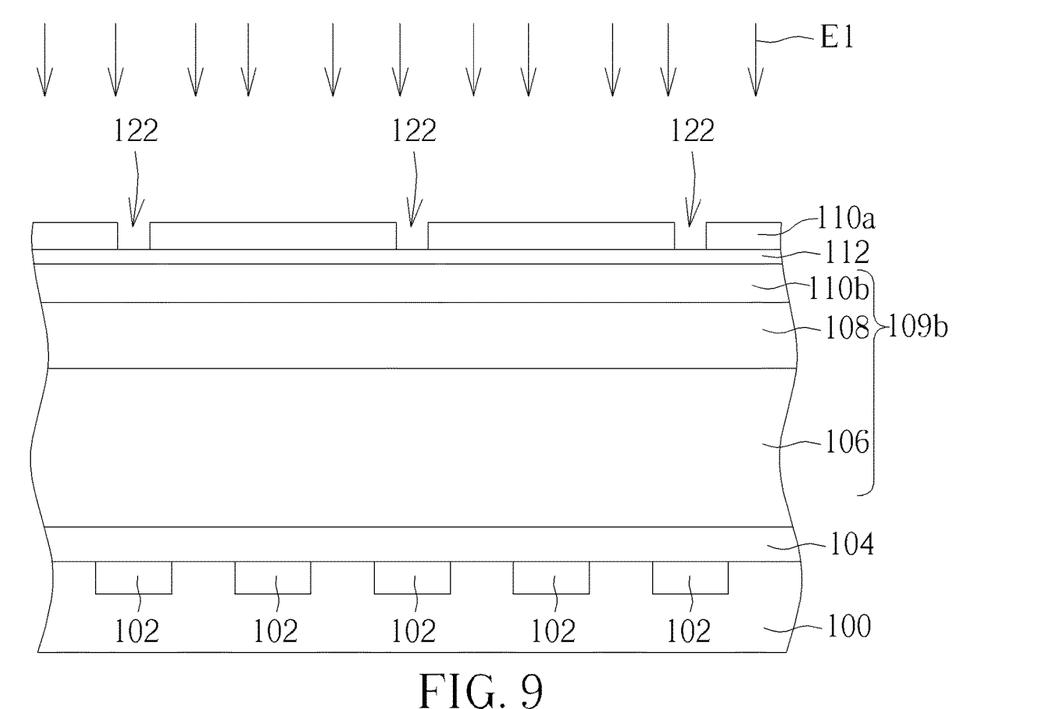

In the following steps, the processes are similar to the processes mentioned in the FIGS. 2-6, but during the first etching process and the second etching process, the first trench openings and the second trench openings are formed "in" the top oxide layer 110a, rather than in the etching stop layer 112. It will be described more detail in the following paragraphs:

As shown in FIG. 8 and FIG. 9, a first photoresist layer (not shown) is formed on the top oxide layer 110a, and a first exposure and development process (not shown) is performed to the first photoresist layer, so as to pattern the first photoresist layer and to form a first patterned photoresist layer 120 on the top oxide layer 110a, the first patterned photoresist layer 120 preferably includes the pattern P1 that defines first trench openings, and the methods for forming the first patterned photoresist layer 120 are known to those skilled in the art, so the details are omitted herein for brevity. Subsequently, as shown in FIG. 9, the first patterned photoresist layer 120 is used as the hard mask, and a first etching process E1 is performed to form at least a first trench 122 in the top oxide layer 110a. It is appreciated that, a top surface of the etching stop layer 112 is exposed in a bottom of the first trench 122, i.e. the first trench 122 does not penetrate through the etching stop layer 112.

Figure 10:
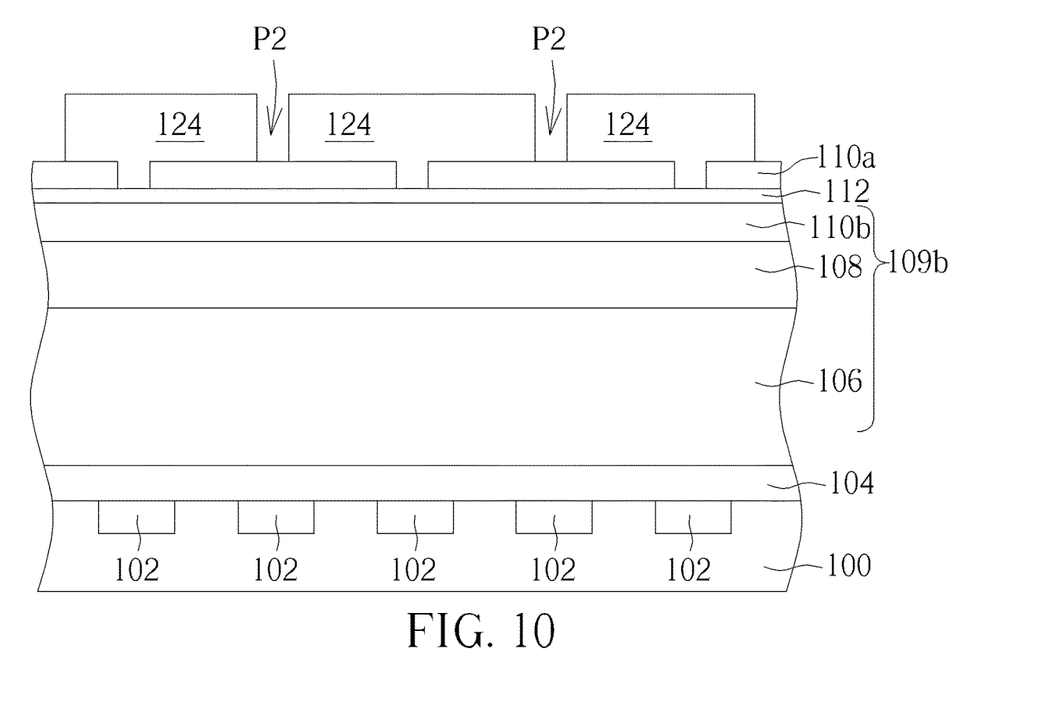

Afterwards, as shown in FIG. 10, the remained first patterned photoresist layer 120 is removed, and a second photoresist layer (not shown) is then formed on the top oxide layer 110a and in the first trench 122. Next, a second exposure and development process (not shown) is performed to the second photoresist layer, so as to pattern the second photoresist layer and to form a second patterned photoresist layer 124 on the top oxide layer 110a and in the first trench 122, the second patterned photoresist layer 124 preferably includes the pattern P2 to define second trench openings, and the methods for forming the second patterned photoresist layer 124 are known to those skilled in the art, so the details are omitted herein for brevity.

The purpose of forming the additional top oxide layer 110a on the etching stop layer 112 and on the bottom oxide layer 110b will be explained in this paragraph: In the embodiment mentioned above, the top oxide layer 110a is additionally formed on the etching stop layer 112 and the bottom oxide layer 110b, and the thickness of the top oxide layer 110a is much smaller than the thickness of the dielectric layer 106. Therefore, the depth of each first trench 122 formed in the top oxide layer 110a is shallow (for example, smaller than 200 angstroms). In this way, if the process parameters for forming the second patterned photoresist layer 124 are the same as those for forming the first patterned photoresist layer 120, the total volume of the second photoresist layer should also be the same as the total volume of the first photoresist layer. After the second photoresist layer is formed, since part of the second photoresist layer will fill in the first trenches 122, so the height of the top surface of the second photoresist layer will decrease. However, as mentioned above, the depth of each first trench 122 formed in the top oxide layer 110a is shallow, so only a small part of the second photoresist layer fills into the first trenches 122, and the top surface of the second photoresist layer will not be decreased significantly. In other words, even though parts of the second patterned photoresist layer 124 fills into the first trenches 122, but the height of the second patterned photoresist layer 124 is very close to the height of the first patterned photoresist layer 120 (for example, according to applicant's experiment, the height difference between the first patterned photoresist layer 120 and the second patterned photoresist layer 124 is smaller than 200 angstroms), so the etching process performed in the following steps will not be affected, thereby improving the accuracy of the process.

Figure 11:
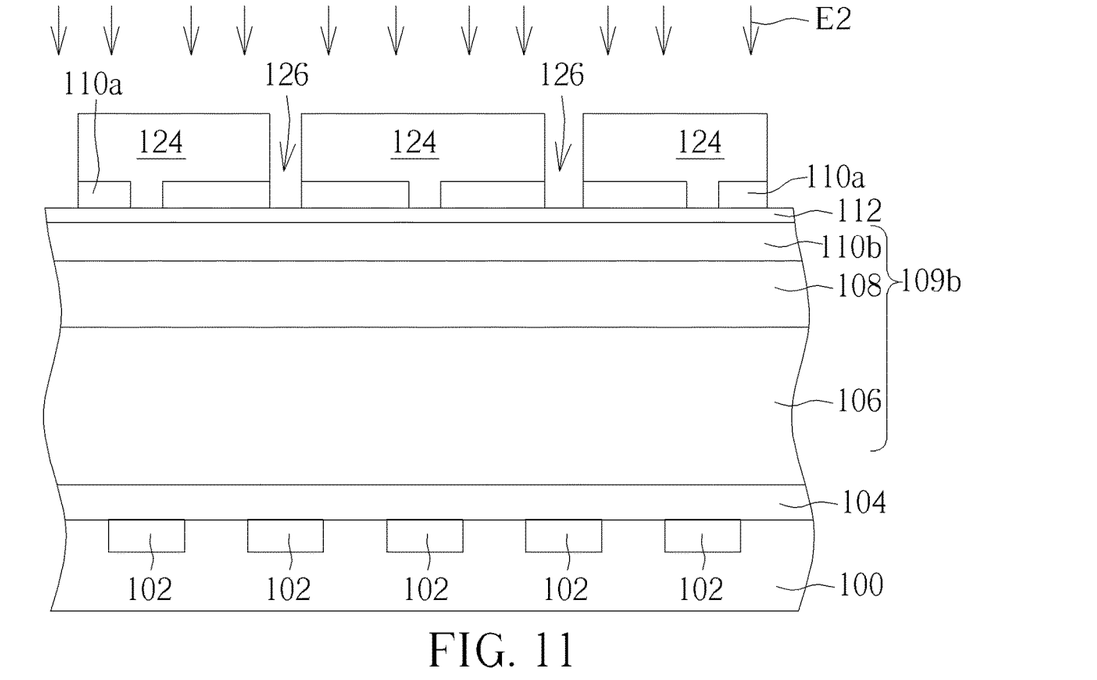

Next, as shown in FIG. 11, the second patterned photoresist layer 124 is used as the hard mask, and a second etching process E2 is performed to form at least a second trench 126 in the top oxide layer 110a. In this embodiment, each first trench 122 and each second trench 126 are preferably not overlapped ith each other. It is appreciated that, a top surface of the etching stop layer 112 is exposed in a bottom of the second trench 126, i.e. the second trench 126 does not penetrate through the etching stop layer 112.

Figure 12:
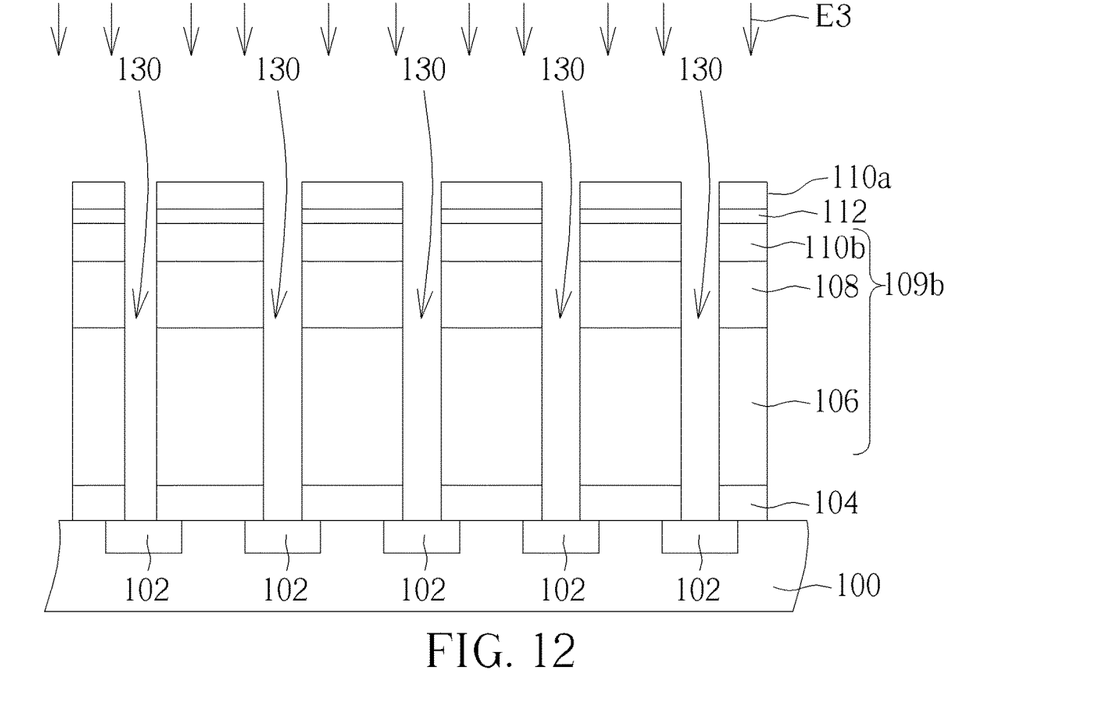

Next, as shown in FIG. 12, after the remained second patterned photoresist layer 124 is removed, the remained top oxide layer 110a is used as the hard mask, and a third etching process E3 is performed, the third etching process may include multiple steps etching processes, to etch the etching stop layer 112, the bottom oxide layer 110b, the mask layer 108, the dielectric layer 106 and the base layer 104 sequentially. A plurality of third trench openings 130 are formed in the dielectric layer 106. Each third trench opening 130 preferably exposes the conductive layers 102. In the following steps, conductive layer (not shown) may be filled into each third trench openings 130, so as to form a plurality of contact plugs, via plugs or other suitable elements. Since those steps are well-known to those skilled in the art, the details are omitted from the preferred embodiment in the interest of brevity.

In summary, in the process mentioned above, the top oxide layer 110a is additionally formed on the etching stop layer 112 and the bottom oxide layer 110b, and the first lithography process, the first etching process, the second lithography process and the second etching process (also called 2P2E process) are performed sequentially, so as to pattern the top oxide layer 110a. Since the thickness of the top oxide layer 110a is relative small, so the height of the second patterned photoresist layer 124 will not be decreased significantly. In this way, it can use the same or similar manufacturing parameters during the second exposure development and the second etching process as the first exposure development and the second etching process, thereby improving the accuracy of the overall semiconductor device (for example, the critical dimension of each trench opening can be maintained).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor device, comprising:
    providing a target layer, wherein the target layer comprises a low dielectric constant layer, a hard mask layer, and an oxide layer;
    forming an etching stop layer on the target layer, wherein the oxide layer contacts the etching stop layer directly;
    forming a first photoresist layer on the etching stop layer;
    performing a first etching process, to form a plurality of first trenches in the etching stop layer;
    forming a second photoresist layer on the etching stop layer, wherein portion of the second photoresist layer fills in each first trench, wherein each first trench is only filled up by the second photoresist layer, and there is no other material layers disposed in each first trench;
    performing a second etching process to form a plurality of second trenches in the etching stop layer; and
    using the remaining etching stop layer as a hard mask, performing a third etching process to remove parts of the target layer.

2. The method of claim 1, wherein each first trench exposes a top surface of the target layer.

3. The method of claim 1, wherein each second trench exposes a top surface of the target layer.

4. The method of claim 1, wherein the hard mask layer comprises metal oxide or metal nitride.

5. The method of claim 1, wherein a thickness of the etching stop layer is T1, and a thickness of the oxide layer is T2, and wherein T1/T2 is smaller than 0.4.

6. The method of claim 1, wherein a thickness of the etching stop layer is smaller than 200 angstroms.

7. The method of claim 1, wherein the low dielectric constant layer comprises an ultra-low-K (ULK) material or a porous ULK material.

8. The method of claim 1, wherein the material of the etching stop layer comprises $Ti_xN_y$, $Al_xN_y$, $Ta_xN_y$, $Ti_xO_y$, $Al_xO_y$, $Ta_xO_y$, $Si_xO_yN_z$, $Si_xC_y$, $Si_xO_yC_z$, and wherein x, y and z are positive integers.

9. The method of claim 1, wherein each first trench does not overlap with each second trench.

* * * * *